United States Patent [19]
Holcomb et al.

[11] Patent Number: 5,686,846
[45] Date of Patent: Nov. 11, 1997

[54] TIME DURATION TRIGGER

[75] Inventors: Matthew S. Holcomb; Warren S. Tustin, both of Colorado Springs, Colo.

[73] Assignee: Hewlett-Packard Company, Palo Alto, Calif.

[21] Appl. No.: 660,313

[22] Filed: Jun. 7, 1996

[51] Int. Cl.$^6$ ............................................. H03K 9/08
[52] U.S. Cl. ............................. 327/37; 327/2; 327/31
[58] Field of Search ........................... 327/2, 3, 12, 24, 327/26, 31, 36–38, 34–35, 227

[56] References Cited

U.S. PATENT DOCUMENTS

| | | | |
|---|---|---|---|
| 4,497,068 | 1/1985 | Fischer | 327/31 |
| 4,857,760 | 8/1989 | Stuebing | 327/31 |
| 4,959,617 | 9/1990 | Martin | 327/3 |
| 5,471,159 | 11/1995 | Stuebing et al. | 327/24 |

*Primary Examiner*—Toan Tran

[57] ABSTRACT

An oscilloscope has a trigger circuit which is operable in any one of three different modes. The trigger circuit has a number of edge detect circuits which generate pulses in response to a rising edge, falling edge, or both rising and falling edges of one or more signals. The trigger circuit has a multiplexer which routes one of three signal sources depending upon the selected mode. With a first mode, the multiplexer routes signals from a pattern detect circuit and the trigger circuit operates in a conventional manner to trigger based on the duration of the signal. In the second mode, the multiplexer routes signals from one edge detect circuit and the trigger circuit measures the frequency or rate of the signal. In the third mode, the multiplexer routes signals from a flip-flop which generates a pulse based upon the outputs from two different edge detect circuits and can be configured to measure setup or hold violations between two signals. The trigger circuit according to the invention can therefore trigger on events more complex than just the duration of a signal and provides this triggering ability without the need for any instrument or circuitry external to the oscilloscope.

23 Claims, 4 Drawing Sheets

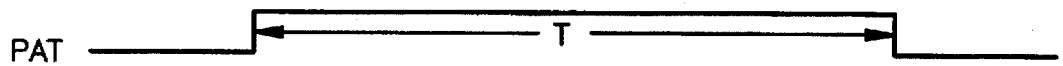
FIG.4(a)
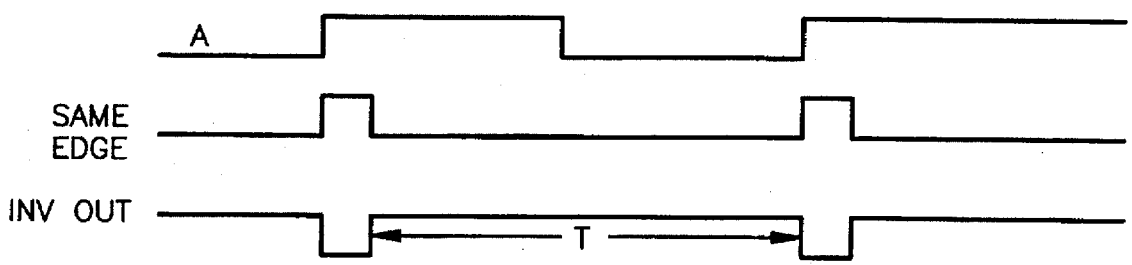
FIG.4(b)
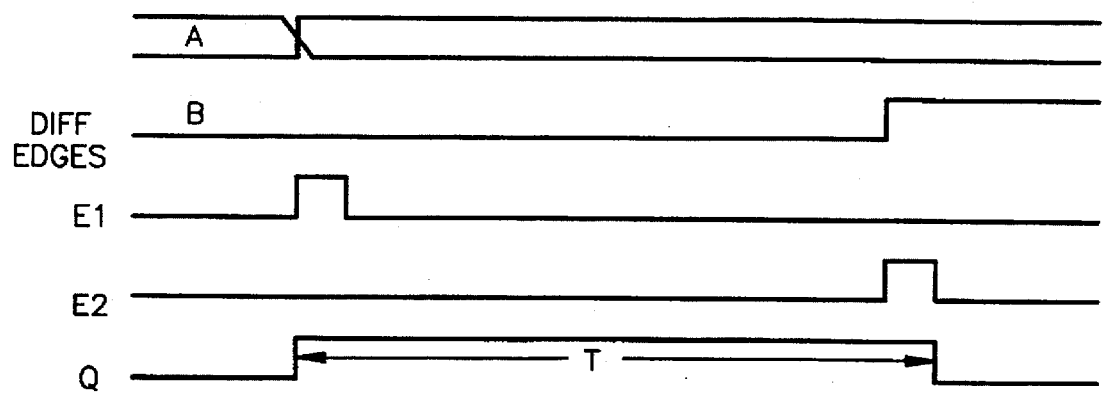
FGI.4(c)

TIME DURATION TRIGGER

BACKGROUND OF THE INVENTION

1. Field of the Invention

The present invention generally relates to a trigger circuit and, more particularly, to a trigger circuit for providing new capabilities to an oscilloscope.

2. Description of the Prior Art

In general, an oscilloscope has a circuit which is triggered upon the occurrence of an event to cause the oscilloscope to provide a display of at least one signal at the time of the occurrence. Frequently, the oscilloscope has more than one channel for receiving an input signal whereby the oscilloscope can display the states of a plurality of signals at the time of the occurrence. The typical oscilloscope is not limited to a display at just one instant of time but rather provides a display of the signals for a certain period of time around the triggering event with this time period being adjustable so that the most relevant portion of the signals are displayed.

One of the triggering events for a conventional oscilloscope is the duration of a signal. If a signal has a time period greater than a user-specified time, less than the user-specified time, within a user-specified range of times, or outside of a user-specified range of times, the time duration trigger circuit within the conventional oscilloscope will become triggered so that the signal and other desired signals will be displayed. The time period which is measured by the oscilloscope may be the time that the signal is at a logical high or, alternatively, the time that the signal is at a logical low.

While the conventional oscilloscope can trigger based on the duration of a signal, the conventional oscilloscope is unable to trigger on a signal having a certain frequency. A previous approach to this problem was to supply the signal source to an external instrument, such as a function generator, which could provide a negative pulse of fixed, known width upon each rising edge of the signal. The output of the function generator would then be input into a second channel of the oscilloscope and the oscilloscope could measure the time between pulses. This type of arrangement, however, was limited by the bandwidth of the instrument, and was relatively expensive since an additional piece of equipment was necessary and also reduced the number of available input channels on the oscilloscope. It is thus a problem in the industry to trigger on a signal of a certain frequency or rate without employing any external piece of equipment.

A conventional oscilloscope is also unable to trigger when violations occur between two different signals. For instance, with many applications, it is desirable to trigger on a setup violation, which occurs when a second signal undergoes a transition too soon after a transition of a first signal. As another example, it is also desirable to trigger on a hold violation, which occurs when the first signal undergoes a transition too soon after the transition of the second signal. Again, to trigger at this time, external equipment would have to be used, where the first event would send the output high and the second would send it low. This arrangement would be even more difficult to set up than in the first case with the frequency of the signal.

Thus, it is difficult to trigger on events other than simply the duration of a signal with a conventional oscilloscope. A need therefore exists for an oscilloscope that can trigger on more complex events, such as a signal having a certain frequency or rate, a setup violation, or a hold violation. A need also exists for an oscilloscope that can trigger on more complex events without requiring an instrument external to the oscilloscope and without reducing the number of available channels of the oscilloscope. A need also exists for an oscilloscope that can selectively trigger only on a violation between two signals.

SUMMARY OF THE INVENTION

An object of the present invention is to provide a circuit which can trigger on a wider range of events.

Another object of the present invention is to provide a circuit that can trigger on a signal having a certain frequency or rate.

Another object of the present invention is to provide a circuit which can trigger on a setup violation between two signals.

Another object of the present invention is to provide a circuit which can trigger on a hold violation between two signals.

Another object of the present invention is to provide an oscilloscope that can trigger on a wider range of events, such as a signal having a certain frequency or rate, a setup violation, or a hold violation, without requiring any external instrument or circuitry.

Additional objects, advantages, and novel features of the invention will be set forth in the description which follows, and will become apparent to those skilled in the art upon reading this description or practicing the invention.

To achieve the foregoing and other objects, a trigger circuit according to a first aspect of the invention comprises at least one edge detect circuit for receiving an input signal and for generating an output signal having first and second pulses synchronized with first and second transitions in the input signal, respectively. A time qualify circuit receives the output signal from the edge detect circuit and measures a duration of time between the two pulses. The time qualify circuit generates a trigger signal based on a comparison of the measured duration of time to a first value of time.

With this circuit, the edge detect circuit can be configured to generate pulses with each rising or falling edge of the input signal. By measuring the time between rising edges or the time between falling edges, the time qualify circuit measures an amount proportional to the frequency or rate of the signal. Thus, the trigger circuit can trigger on the frequency or rate of a signal without requiring any external instrument or circuitry.

In another aspect, a trigger circuit according to the invention has two edge detect circuits. A first edge circuit produces pulses in response to transitions in a first signal and a second edge detect circuit produces pulses in response to transitions in a second signal. The time qualify circuit measures the time between pulses from the first and second edge detect circuits and generates the trigger signal based on a comparison of the measured time to a first value of time.

According to this other aspect of the invention, the trigger circuit can be used to detect such events as a setup or hold violation between two signals. The first edge detect circuit would generate pulses with the rising edges or falling edges of one signal while the second edge detect circuit would generate pulses with the rising or falling edges of the second signal. The time qualify circuit could generate the trigger signal only when a violation occurred, such as when the second signal transitions too early or too late relative to the first signal.

3

In yet a further aspect of the invention, a trigger circuit is operable in at least two different modes. In a first mode, a time qualify circuit measures the duration of time that a first signal is at a first logical state. In a second mode, the time qualify circuit instead effectively measures the time between successive transitions in the first signal. Thus, if the transitions which are detected are just the rising edges or just the falling edges of the first signal, the time qualify circuit can generate a trigger signal based on the frequency or rate of the first signal. The trigger circuit may additionally be placed in a third mode in which the time qualify circuit detects the time between a transition in the first signal and a transition in a second signal. In the third mode, the trigger circuit can trigger on such events as a setup or hold violation between two signals.

BRIEF DESCRIPTION OF THE DRAWINGS

The accompanying drawings, which are incorporated in, and form a part of, the specification, illustrate a preferred embodiment of the present invention and, together with the description, serve to explain the principles of the invention. The drawings are not necessarily to scale, emphasis instead being placed upon clearly illustrating the principles of the invention. In the drawings:

FIGS. 4a–4c are timing charts illustrating time periods measured by the trigger circuit of FIG. 1 in three different modes.

DETAILED DESCRIPTION OF THE PREFERRED EMBODIMENT

Figure 1:
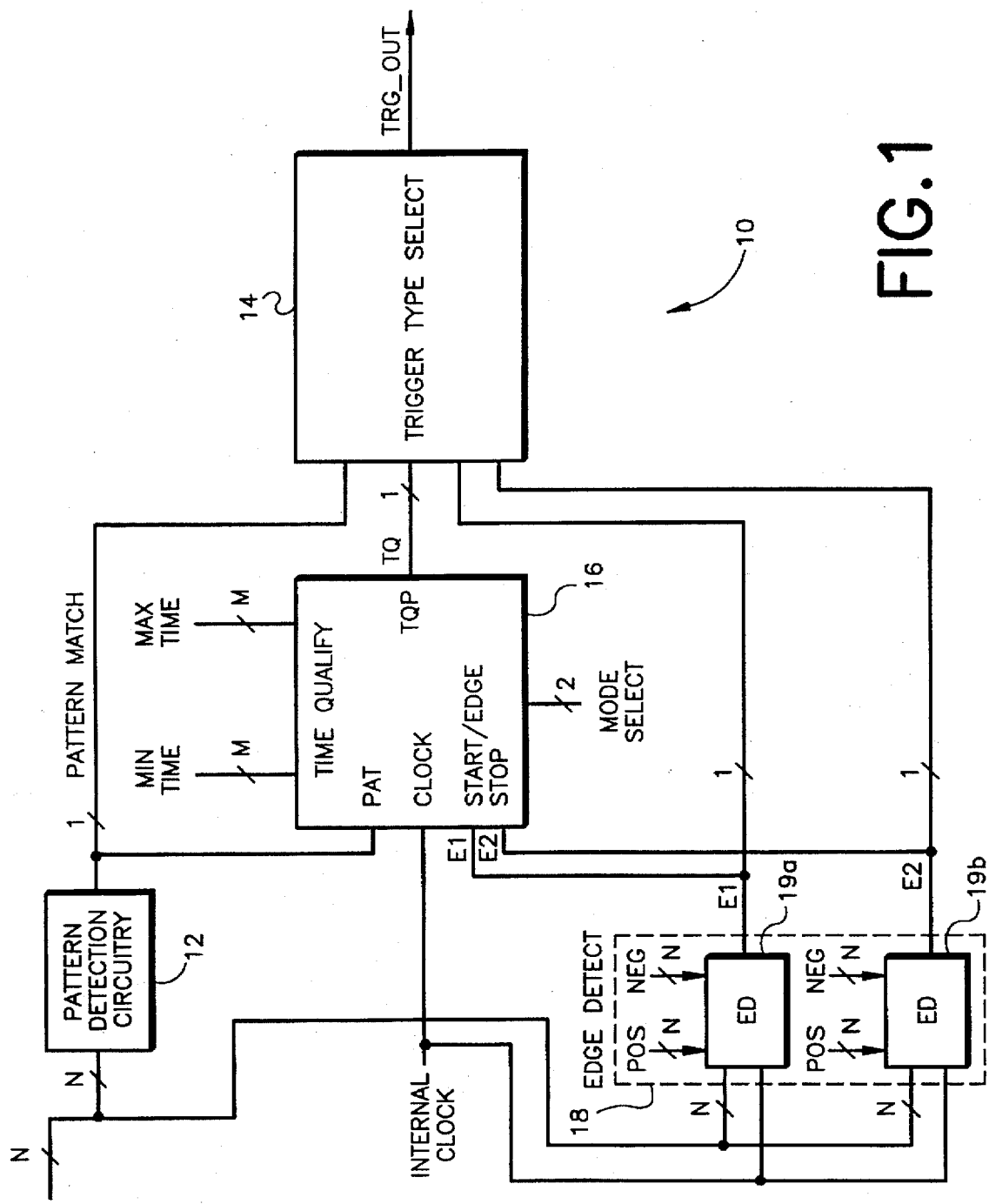
FIG. 1 is a block diagram of a trigger circuit according to a preferred embodiment of the invention.

Reference will now be made in detail to the preferred embodiment of the invention. With reference to FIG. 1, a trigger circuit 10 according to a preferred embodiment of the invention comprises N input channels for receiving signals from up to N different signal sources. The N different channels are connected to a pattern detection circuitry 12 which translates one of the N input signals or a combination of N input signals into a single pattern match signal which is input to a time qualify block 16. The pattern detection circuitry 12 can selectively send any one of the N input signals to the time qualify block 16 or can selectively AND or OR any combination of the N signals in order to form the single pattern match signal supplied to the time qualify block 16. The pattern detection circuitry 12 can be any suitable pattern detection circuitry, such as conventional pattern detection circuitry.

The time qualify block 16 receives the pattern match signal from the pattern detection circuitry 12 and, in a first mode of operation, performs similar to a conventional time qualify block. More specifically, in this first mode, the time qualify block 16 provides a trigger signal TQ when a duration of the pattern match signal is greater than a certain time, less than a certain time, is within a range of times, or is outside a range of times. The minimum and maximum times are each specified by the user over M lines, as is conventional in the art.

The output of the pattern detection circuitry 12 is also input to a trigger type select circuit 14. The trigger type select circuit 14 is preferably a known trigger type select circuit but, alternatively, may comprise any suitable trigger type select circuit. The trigger type select circuit 14 provides additional gating capability and may include a sequencer, hold-off circuitry, and circuitry for generating a system trigger and an external trigger signal (Trg out).

In contrast to a conventional oscilloscope, the oscilloscope according to the invention further comprises edge detect circuitry 18. In this example, the oscilloscope has two edge detect circuits 19a and 19b. It should be understood, however, that an oscilloscope according to the invention may have a greater number of edge detect circuits 19. In general, each edge detect circuit 19 generates a pulse with the occurrence of each rising edge or each falling edge of any one of the N signals. The edge detect circuits 19 are supplied with an internal clock signal and generate the pulses for only one clock pulse. The outputs E1 and E2 from the edge detect circuits 19a and 19b, respectively, are input to the time qualify block 16.

Also in contrast to a conventional oscilloscope, the time qualify block 16 has a mode select input and the additional pair of inputs E1 and E2 for the outputs of the edge detect circuits 19a and 19b, respectively. The mode select input receives signals over a pair of lines for placing the oscilloscope in any one of three modes. The first mode, discussed above, places the oscilloscope in a conventional mode of operation in which the time qualify block 16 triggers based on the duration of the pattern match signal from the pattern detection circuitry 12. In a second mode of operation, the time qualify block 16 is capable, for instance, of measuring the frequency or rate of the output signal E1 and in a third mode the time qualify block 16 is capable, for instance, of detecting setup or hold violations between output signals E1 and E2. Thus, in contrast to a conventional oscilloscope, the oscilloscope according to the invention is operable in any one of three different modes.

Figure 2:
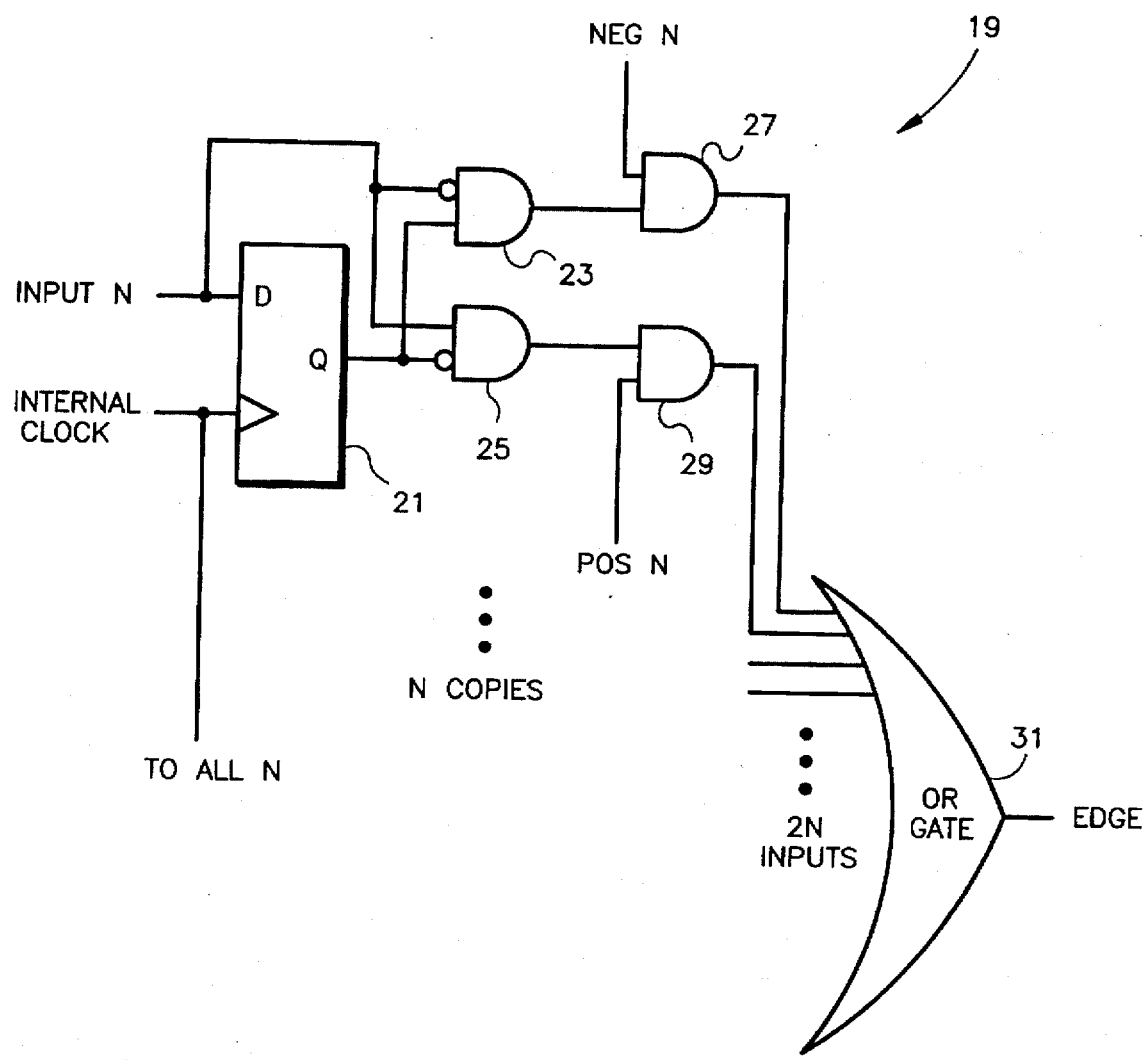
FIG. 2 is a logic circuit diagram of an edge detect circuit shown in FIG. 1.

With reference to FIG. 2, a preferred embodiment of the edge detect circuit 19 comprises a D flip-flop 21 receiving the internal clock at its clock input and an input from one of the N signals at its D input. The Q output of the flip-flop 21 is supplied to an input of AND gate 23 and to an inverted input of AND gate 25. The input from one of the N input signals is also supplied to an inverted input of AND gate 23 and to an input of AND gate 25. The output of AND gate 23 is passed through an AND gate 27 along with an input NEG N and the output of AND gate 25 is passed through AND gate 29 along with an input POS N. The outputs of AND gates 27 and 29 are input to an OR gate 31 with the output of the OR gate 31 being the output of the edge detect circuit 19, such as E1 or E2.

In operation, when the input signal has a rising edge, the Q output of the D flip-flop 21 remains low for one clock period while the input signal is high. The AND gate 25 consequently provides a high signal to AND gate 29 which provides a high signal to OR gate 31, if the POS N signal is also high. The POS N signal and NEG N signal determine whether the edge detect circuitry 19 will generate a pulse on a rising edge or on a falling edge, respectively. Thus, if the POS N signal is received, the edge detect circuitry 19 is enabled to generate a pulse on the rising edge of the input signal. With the next clock pulse from the internal clock, the Q output will change to a high state whereby the output of the AND gate 25 is forced low. Thus, if the POS N is supplied to the edge detect circuitry, the edge detect circuitry 19 will generate a pulse of one clock period in duration for each rising edge of the input signal.

If the NEG N signal is supplied to the edge detect circuitry 19, then the circuitry 19 will generate a pulse with the occurrence of each falling edge. While the input signal is high, the Q output of the flip-flop 21 is also high. As soon as the input signal goes low, the AND gate 23 outputs a high signal which is supplied to the AND gate 27. With the NEG N signal being received, the AND gate 27 outputs a high signal which is passed through the OR gate 31. After one clock period, the Q output of the flip-flop 21 is set low thereby terminating the pulse passed through the AND gates 23 and 27 and through the OR gate 31. Each pair of outputs is supplied to the OR gate 31 whereby the OR gate 31 receives up to 2N inputs and supplies the selected edges to the output E1 or E2 for edge detect circuits 19a and 19b, respectively.

Figure 3:
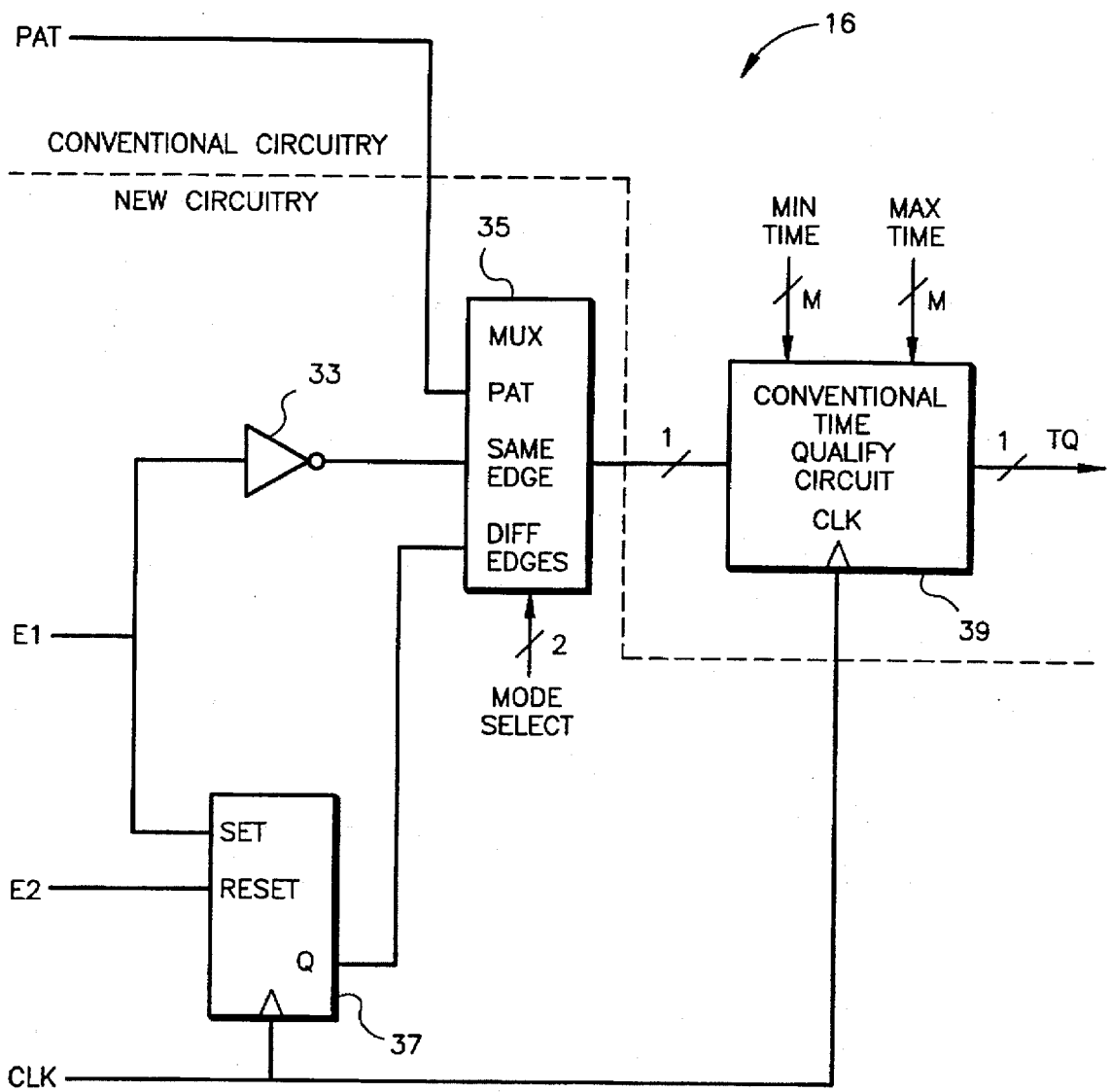
FIG. 3 is a logic circuit diagram of a time qualify circuit shown in FIG. 1.

With reference to FIG. 3, the time qualify block 16 comprises an inverter 33, a multiplexer 35, a set-reset flip-flop 37, and a conventional time qualify circuit 39. The multiplexer 35 receives the mode select signal and routes one of the three inputs to the conventional time qualify circuit 39 based on the value of the mode select signal.

For instance, if the value of the mode select signal is a binary 00, then the multiplexer 35 routes the pattern match signal to the conventional time qualify circuit 39. In this first mode, the trigger circuit 10 operates as a conventional trigger circuit and can generate a trigger signal TQ if the duration of the pattern match signal is greater than a maximum time, less than a minimum time, outside the range of times defined by maximum and minimum times, or within the range of times defined by maximum and minimum times. As shown in FIG. 4(a), the time qualify circuit 39 measures the time period T which is the duration during which the pattern match signal is high.

When the value of the mode select signal is a binary 01, the trigger circuit is placed in a second mode of operation. In the second mode, the multiplexer 35 routes the output signal E1 from the edge detect circuit 19a after the signal E1 has passed through the inverter 33. As discussed above, the signal E1 may comprise pulses generated for each rising edge, each falling edge, or both each rising and falling edge of a single signal. Additionally, the signal E1 may be based on a combination of signals such that, for instance, pulses may be generated for the rising edges of one signal and the falling edges of a different signal.

With the second mode of operation, the edge detect circuit 19a can advantageously be enabled to detect the frequency or rate of a signal. To detect the frequency or rate of a signal, the edge detect circuit 19a receives the POS N signal for only one of the N signals. As shown in FIG. 4(b), the edge detect circuit 19a generates a pulse at each rising edge of a signal A. The time qualify circuit 39 receives the inverted signal E1 and measures the duration of the time period T between pulses. Since the frequency is equal to 1/T, the time qualify circuit 39 can trigger on signals having a frequency greater than a certain amount, less than a certain amount, within a range of frequencies, or outside a range of frequencies. The maximum, minimum, and limits of the ranges are set within the time qualify circuit 39 based on the min and max times.

When the value of the mode select signal is a binary 10, the multiplexer 35 is placed in a third mode of operation and routes the signals from the set-reset flip—flip 37 to the conventional time qualify circuit 39. In this mode of operation, the signal pulse output E1 from the edge detect circuit 19a is input to the set input of the flip-flop 37 and the signal pulse output E2 from the edge detect circuit 19b is input to the reset input of the flip-flop 37. Thus, the time qualify circuit 39 will trigger based on the duration of time between a pulse on output E1 and a pulse on output E2.

The third mode can advantageously be used to detect setup or hold violations between two signals. For instance, with reference to FIG. 4(c), the edge detect circuit 19a is configured so as to pulse its output signal E1 with either edge of a signal A and the edge detect circuit 19b is configured to pulse its output signal E2 with each rising edge of a signal B. The pulse on signal E1 sets the flip-flop 37 and causes the Q output to go high. The Q output remains high until signal B goes high. Once signal B goes high, the Q output of the flip-flop 37 goes low, thereby defining the end of the time period T. With this configuration, the time qualify circuit 39 can trigger when the setup time is less than a certain time, greater than a certain time, within a range of times, or outside a range of times.

While not shown, the minimum time, maximum time, and mode select signals may be generated by a microprocessor. The microprocessor may have an input interface for receiving values for the minimum and maximum times and the desired mode from a user. The values for the maximum and minimum times and the setting of the mode, however, may be performed in any suitable manner, such as with switches that can be manually set to the desired values.

The trigger circuit 10 according to the invention can trigger on a wider range of events than that of a conventional oscilloscope. The trigger circuit 10 can not only maintain the ability to trigger on the duration of a signal, as is done conventionally, but can also trigger on based on the frequency of a signal or based on the relationship between two different signals. Consequently, the trigger circuit 10 can trigger on such events as a setup violation or a hold violation between two signals. Furthermore, the trigger circuit 10 is able to trigger on these additional events without requiring any instrument or circuitry external to the oscilloscope and without reducing the number of available input channels.

The foregoing description of the preferred embodiment of the invention has been presented for purposes of illustration and description. It is not intended to be exhaustive or to limit the invention to the precise form disclosed. Many modifications and variations are possible in light of the above teaching.

For instance, while the invention is described as being applicable to the triggering on the frequency of a signal, a setup violation, or a hold violation, the invention can be used to trigger on events representing other relationships between signals. Also, the trigger circuit 10 according to the invention may employ a multiplexer which can switch between a greater number of signal sources or, if desired, a fewer number of signal sources.

The embodiment was chosen and described in order to explain the principles of the invention and their practical application to thereby enable others skilled in the art to utilize the invention and various embodiments and with various modifications as are best suited to the particular use contemplated. It is intended that the scope of the invention be defined by the claims.

We claim:

1. A trigger circuit for use in an oscilloscope, comprising:
    at least one edge detect circuit for receiving an input signal and for generating an output signal having first and second pulses synchronized with first and second transitions in said input signal, respectively; and
    time qualify circuit for receiving said output signal said one edge detect circuit and for measuring a duration of time between said first and second pulses;
    wherein said time qualify circuit generates a trigger signal based on a comparison of said duration of time to a first value of time.

2. The trigger circuit as set forth in claim 1, wherein said first and second transitions are both from a first logical state to a second logical state and said one edge detect circuit generates pulses only with transitions from said first logical state to said second logical state.

3. The trigger circuit as set forth in claim 2, wherein said first logical state is a logical value of 0 and said second logical state is a logical value of 1.

4. The trigger circuit as set forth in claim 1, wherein said time qualify circuit generates said trigger signal when said duration of time is greater than said first value of time.

5. The trigger circuit as set forth in claim 1, wherein said time qualify circuit generates said trigger signal when said duration of time is less than said first value of time.

6. The trigger circuit as set forth in claim 1, wherein said time qualify circuit generates said trigger signal when said duration of time is between a range defined by said first value of time and a second value of time.

7. The trigger circuit as set forth in claim 1, wherein said time qualify circuit generates said trigger signal when said duration of time is outside of a range defined by said first value of time and a second value of time.

8. The trigger circuit as set forth in claim 1, wherein said edge detect circuit comprises:

a D flip-flop having an input for receiving said input signal, a clock input for receiving an internal clock, and a Q output;

a first AND gate for receiving said Q output and an inverted input signal;

a second AND gate for receiving an inverted Q output and said input signal;

a third AND gate for receiving an output from said first AND gate and a first enable signal;

a fourth E gate for receiving an output from said second AND gate and a second enable signal; and an OR gate for receiving outputs from said third and fourth AND gates;

wherein said first enable signal is for causing said one edge detect circuit to generate a pulse with each falling edge of said input signal and said second enable signal is for causing said one edge detect circuit to generate a pulse with each rising edge of said input signal.

9. The trigger circuit as set forth in claim 1, wherein said time qualify circuit comprises an inverter for inverting said output signal and time measuring circuitry for measuring said duration of time based on the inverted output signal.

10. A trigger circuit for use in an oscilloscope, comprising:

a first edge detect circuit for receiving a first input signal and for generating a first output signal having a first pulse synchronized with a first transition in said first input signal;

a second edge detect circuit for receiving a second input signal and for generating a second output signal having a second pulse synchronized with a second transition in said second input signal; and a time qualify circuit for receiving said first and second output signals from said first and second edge detect circuits and for measuring a duration of time between said first and second pulses;

wherein said time qualify circuit generates a trigger signal based on a comparison of said duration of time to a first value of time.

11. The trigger circuit as set forth in claim 10, wherein said first edge detect circuit generates said first pulse in response to a rising edge in said first input signal and said second edge detect circuit generates said second pulse in response to a rising edge in said second input signal.

12. The trigger circuit as set forth in claim 10, wherein said first edge detect circuit generates said first pulse in response to a rising edge in said first input signal and said second edge detect circuit generates said second pulse in response to a falling edge in said second input signal.

13. The trigger circuit as set forth in claim 10, wherein said first edge detect circuit generates said first pulse in response to a falling edge in said first input signal and said second edge detect circuit generates said second pulse in response to a falling edge in said second input signal.

14. The trigger circuit as set forth in claim 10, wherein said first edge detect circuit generates said first pulse in response to a falling edge in said first input signal and said second edge detect circuit generates said second pulse in response to a rising edge in said second input signal.

15. The trigger circuit as set forth in claim 10, wherein said time qualify circuit comprises a set-reset flip-flop having a Q output which is set high in response to said first pulse from said first edge detect circuit and is reset low in response to said second pulse by said second edge detect circuit.

16. The trigger circuit as set forth in claim 15, wherein said time qualify circuit further comprises time measuring circuitry for measuring said duration of time based on a time that said Q output from said set-reset flip-flop remains high.

17. The trigger circuit as set forth in claim 10, wherein said time qualify circuit generates said trigger signal when said duration of time is greater than said first value of time.

18. The trigger circuit as set forth in claim 10, wherein said time qualify circuit generates said trigger signal when said duration of time is less than said first value of time.

19. The trigger circuit as set forth in claim 10, wherein said time qualify circuit generates said trigger signal when said duration of time is between a range defined by said first value of time and a second value of time.

20. The trigger circuit as set forth in claim 10, wherein said time qualify circuit generates said trigger signal when said duration of time is outside of a range defined by said first value of time and a second value of time.

21. A trigger circuit for use in an oscilloscope and capable of being placed into at least two different modes, comprising:

means for receiving a first input signal;

means for generating a second input signal based on a third input signal, said generating means having an edge detect circuit for producing pulses each time said third input signal undergoes a transition from one logical state to another logical state and an inverter for inverting an output of said edge detect circuit;

a multiplexer for receiving said first and second input signals and for selectively routing one of said first or second input signals as an output signal of said multiplexer;

mode selecting means for placing said multiplexing means into one of a first mode or a second mode, said multiplexer routing said first input signal as said output signal in said first mode and said second signal as said output signal in said second mode; and a time qualify circuit for receiving said output signal from said multiplexing means, for measuring a duration of time during which said output signal is in a first logical state, and for generating a trigger signal based on a comparison of said time duration to a first value of time;

wherein said time qualify circuit generates said trigger signal based on said first input signal when in said first mode and said time qualify circuit generates said trigger signal based on said second input signal when in said second mode.

22. The trigger circuit as set forth in claim 21, wherein said third signal is said first signal.

23. The trigger circuit as set forth in claim 21, further comprising:

means for producing a fourth input signal, said fourth input signal being at said first logical state for a period of time from a second transition in said third signal to a third transition in a fifth signal;

said mode selecting means for placing said multiplexer in a third mode and said multiplexer routing said fourth input signal as said output signal of said multiplexer when said multiplexer is in said third mode;

wherein said time qualify circuit generates said trigger signal based on fourth input signal when said multiplexer is in said third mode.

* * * * *